(12) United States Patent
Traeger et al.

(10) Patent No.: US 9,184,717 B2
(45) Date of Patent: Nov. 10, 2015

(54) POWER CONTROL DEVICE

(75) Inventors: Robert Traeger, Riemerling (DE); Stefan Kreusser, Olching (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 1770 days.

(21) Appl. No.: 11/908,925

(22) PCT Filed: Mar. 29, 2006

(86) PCT No.: PCT/EP2006/002863
§ 371 (c)(1),
(2), (4) Date: Dec. 6, 2007

(87) PCT Pub. No.: WO2006/103059
PCT Pub. Date: Oct. 5, 2006

(65) Prior Publication Data
US 2008/0212712 A1    Sep. 4, 2008

(30) Foreign Application Priority Data

Apr. 1, 2005 (DE) .......................... 10 2005 015 092
Jan. 12, 2006 (DE) .......................... 10 2006 001 687

(51) Int. Cl.
*H04L 27/00* (2006.01)
*H03G 3/30* (2006.01)
(52) U.S. Cl.
CPC .................................... *H03G 3/3042* (2013.01)
(58) Field of Classification Search
USPC ........................................................ 375/295
See application file for complete search history.

(56) References Cited

U.S. PATENT DOCUMENTS

| 4,729,129 | A | | 3/1988 | Koerner |
| 4,785,229 | A | * | 11/1988 | Edwards ........................ 323/284 |
| 7,274,919 | B2 | * | 9/2007 | Hirtzlin et al. ............. 455/188.1 |
| 7,333,153 | B2 | * | 2/2008 | Hartson et al. ................ 348/608 |
| 7,468,761 | B1 | * | 12/2008 | Fiesel ............................ 348/725 |
| 2002/0141509 | A1 | | 10/2002 | Hoffmann |

FOREIGN PATENT DOCUMENTS

| DE | 27 10 752 | 9/1978 |
| DE | 3821 181 | 12/1989 |
| DE | 39 18 159 | 12/1990 |
| DE | 4129011 A1 | 3/1993 |
| DE | 19614655 A1 | 10/1997 |
| DE | 10257435 B3 | 9/2004 |

OTHER PUBLICATIONS

English Translation of International Preliminary Report on Patentability Chapter I.*
English Translation of the Written Opinion of the International Search Authority.*
Official Communication in DE 10 2006 001 687.4 dated Jun. 3, 2014.

* cited by examiner

*Primary Examiner* — Nader Bolourchi
(74) *Attorney, Agent, or Firm* — Marshall, Gerstein & Borun LLP

(57) ABSTRACT

The invention relates to a power control device for a power output stage. A forward signal corresponding to a wave advancing on a wall feed line and a return signal corresponding to a wave returning on the wave feed line is obtained by means of a directional coupler and is supplied to a controller after narrow-band selection for controlling the output of the power output stage. Narrow-band selection is not carried out in the baseband but on an intermediate frequency level above the baseband.

22 Claims, 2 Drawing Sheets

POWER CONTROL DEVICE

CROSS REFERENCE TO RELATED APPLICATIONS

This application is the U.S. National Phase of International Application Number PCT/EP2006/002863, entitled "Power Control Device," which was filed on May 26, 2006, which claims priority to UK Patent Application Number GB 10 2005 015 092.6, filed on Apr. 1, 2005 and claims priority to UK Patent Application Number GB 10 2006 001 687.4 filed on Jan. 12, 2006, the entire disclosure of each of which is hereby expressly incorporated by reference herein.

BACKGROUND OF THE INVENTION

1. Field of the Invention

The invention relates to a power-control device for power-output units.

2. Related Technology

In order to protect power amplifiers, especially their high-frequency power transistors, from power overload caused by reflected power from the antenna if the antenna is inadequately matched, it is conventional to monitor the forward and return waves moving on the antenna supply line by means of a directional coupler and if necessary to reduce the input level to the power output units via a control circuit. With transmitters disposed in close spatial proximity, which are operated within the same frequency range, in some cases, with only a slight frequency difference, for example, on ships, narrow-band transmission filters are often inserted into the antenna supply line to avoid an undesirable reduction in transmission power. However, these have the disadvantage that they are extremely complex because of their narrow bandwidth; they are therefore expensive, and the high-frequency switching elements are exposed to extreme stress.

It is already known from DE 39 18 159 A1 that the control circuit can be operated in a frequency-selective manner in order to avoid this narrow-band transmission filter. For this purpose, the forward signal and the return signal obtained from the directional coupler are both subjected to an I/Q demodulation, wherein a reference signal, which is derived from the high-frequency signal branch before the power-output unit to be controlled, is used for the mixer of the I/Q demodulator. The frequency selectivity in this case is dependent upon the edge steepness of the low-pass filters connected downstream of the mixers in the in-phase (I) branch and the quadrature-phase (Q) of the baseband. Relatively stringent requirements must therefore be placed on the low-pass filters, of which a total of four are required (one for the I-branch and Q-branch of the forward signal and the return signal respectively), which can generally only be fulfilled by active filters with relatively complex circuit technology. Moreover, the control signal must be generated in a complex manner by means of a total of four squaring units, two adding units and two root-extractor units. If the alternative suggestion of realising this procedure by means of digital signal processing operating in multiplex mode is taken up, the complexity is still considerable even with this digital realisation.

GENERAL DESCRIPTION OF THE INVENTION

The invention therefore provides a power-control arrangement for power-output units with significantly reduced complexity.

Accordingly, the invention provides a power-control arrangement for a power-output unit, in which a forward signal corresponding to a forward wave on a wave supply line and a return signal corresponding to a return wave on the wave supply line are obtained via a directional coupler and supplied, after a narrow-band selection, to a controller in order to control the power of the power-output unit, characterized in that the narrow-band selection is implemented not in the baseband but at a constant intermediate-frequency level above the baseband.

The invention implements the narrow-band selection not in the baseband, but at an intermediate-frequency level above the baseband.

Accordingly, the mixers in the forward signal branch and the return signal branch do not mix in the zero frequency position of the baseband, but in an intermediate-frequency position. By preference, the intermediate-frequency position is not reduced with reference to the high-frequency position, but is, in fact, even somewhat raised. In this intermediate-frequency position, very narrow-band filters, preferably surface-wave filters can then be used for the frequency selection. These intermediate-frequency filters are designed substantially more simply, than the low-pass filters used according to the prior art in the baseband. Moreover, with surface-wave filters, substantially increased edge steepness can be realised by comparison with low-pass filters in the baseband. Accordingly, the cost and also the structural space for realisation can be considerably reduced by comparison with the solution known from the prior art.

One preferred embodiment does not use a reference signal, which is decoupled from the high-frequency signal branch before the power-output unit to be controlled, but uses an internally-generated reference signal.

It is advantageous to take the reference signal for the mixers in the selective signal branches from a special synthesizer, which also provides the signal conditioning in the control transmitter connected upstream of the power-output unit. Accordingly, the reference signal does not have to be picked up immediately before the power-output unit, as provided in the prior art, and the synthesizer, which is already provided, can be used to obtain the reference signal.

In this context, the reference signal is not taken from the synthesizer used in the actual transceiver, but, according to the invention, is generated directly. This is a substantial advantage, for example, because a generation of the reference signal from the actual high-frequency signal branch is very complex in the case of signals with a suppressed carrier and because no reference signal is available during transmission pauses of the actual transmitter, during which, however, interference signals from adjacent transmitters are present.

Furthermore, alongside the selective forward signal branch and the selective return signal branch, it is advantageous to provide a broadband forward signal branch and a broadband return signal branch, of which the bandwidth extends over the entire useful bandwidth of the power-output unit and is not selectively limited to the momentary transmission signal. The broadband forward signal branch can then be used for an emergency shutdown by comparing the broadband forward signal with the selective forward signal in an appropriate comparator. If a forward signal with a high level is present in the broadband signal branch, but the level of the selective forward signal is low, this indicates an error in the signal conditioning of the selective forward signal branch. If the broadband forward signal branch were not present, the controller would increase to the maximum, in spite of the possibility of a relatively high return signal level in this case, because the controller would erroneously assume a small forward signal because of the error in the selective forward signal branch. However, if the broadband forward signal is registered at the same time, an emergency shutdown, optionally with a time delay, can be implemented beyond a certain threshold value.

The broadband return signal branch can be used to reduce the transmission power of the power-output unit, if a high return signal caused by an adjacent transmitter occurs outside the selective return signal adjusted to the momentary operating frequency. According to the invention, if adjacent transmitters are transmitting only at a low level, a reduction should, in fact, be just avoided. However, if these transmitters transmit at such a high level, that there is a risk of destroying the power-output unit, the power of the power-output unit should be reduced accordingly. This is realised in that the broadband return signal over-drives and dominates the selective return signal from a certain level, while the selective return signal dominates almost exclusively below this threshold value.

BRIEF DESCRIPTION OF THE DRAWINGS

An exemplary embodiment of the invention is explained in greater detail below with reference to the drawings. The drawings are as follows.

DETAILED DESCRIPTION

Figure 1:
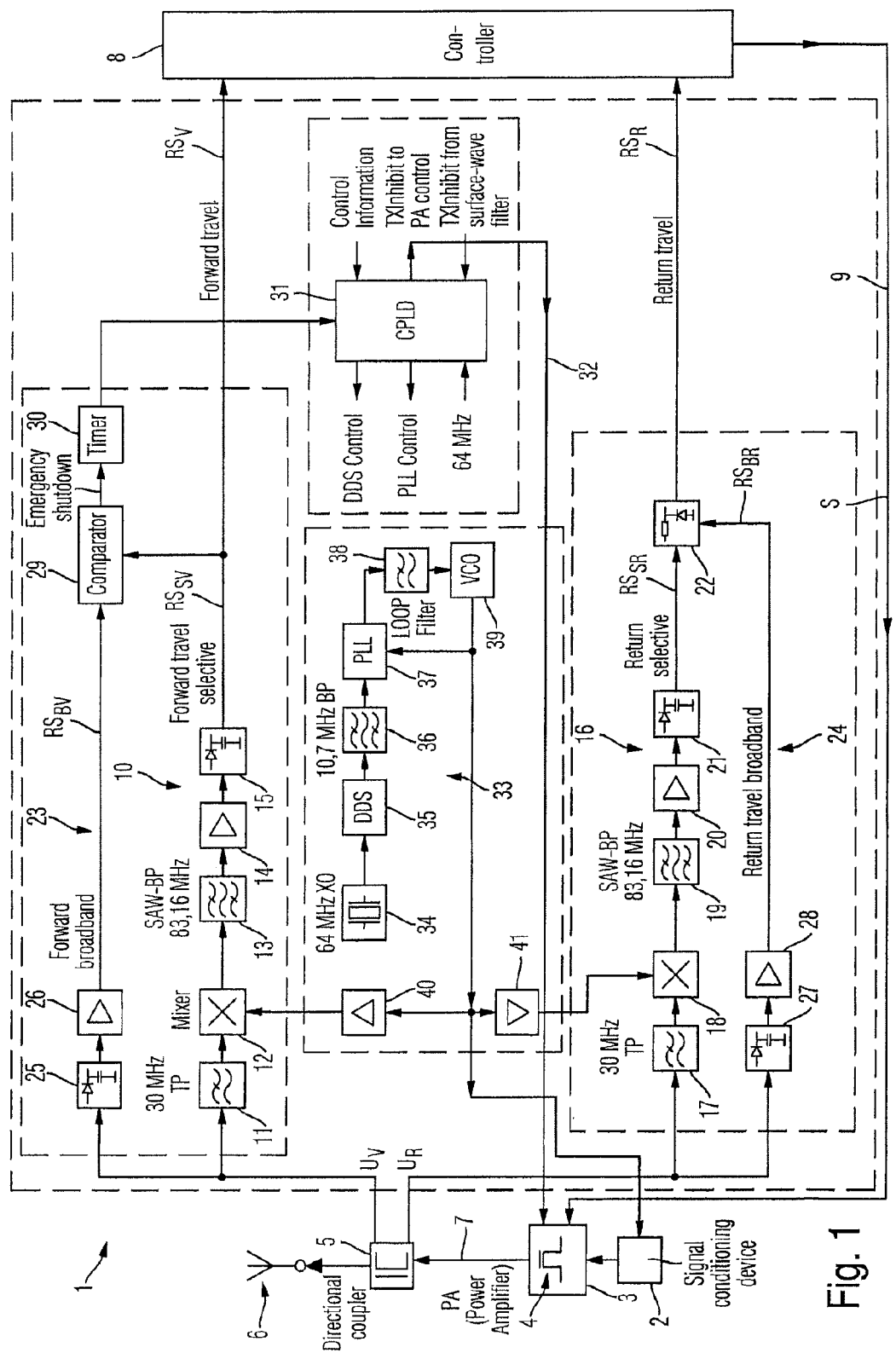
FIG. 1 shows a block circuit diagram of an exemplary embodiment of the power-control device according to the invention and FIG. 2 shows an application of the power-control device according to the invention in a broadband system.

FIG. 1 shows an exemplary embodiment of the power-control device according to the invention, which is indicated as a whole with the reference number 1. With regard to the transmission device, the signal conditioning (including modulation, filtering and mixing upwards to the operating frequency) takes place in a signal-conditioning device 2, which is not presented in greater detail. The transmission signal is supplied in the high-frequency position to a power amplifier 3, which contains a power-output unit 4, generally providing high-frequency power transistors. The transmission signal is supplied to an antenna 6 via a wave supply line 7 and a directional coupler 5.

In the event of a poorly-matched antenna 6, some of the transmission power is reflected back to the power-output unit 4 of the power amplifier 3, where it is absorbed. This can lead to overheating and in an extreme case to the destruction of the high-frequency power transistors. Accordingly, a control device must be provided, which registers the ratio between the wave travelling forward on the supply line 7 to the antenna and the wave reflected back from the antenna 6 on the supply line 7 and calculates the Voltage Standing Wave Ratio (VSWR) from this ratio. With an increasing standing wave ratio, the power of the power-output unit 4 of the power amplifier 3 must be reduced. For this purpose, a forward signal $U_V$, which corresponds to the level of a wave travelling forward on the supply line 7, and a return signal $U_R$, which corresponds to the level of the wave returning on the supply line 7 are generated in the directional coupler 5. A forward-control signal $RS_V$ is determined from the forward signal $U_V$, and a return-control signal $RS_R$ is determined from the return signal $U_R$. These control signals are supplied to a controller 8, which determines from them the standing wave ratio, and dependent upon this, generates an adjustment signal S, which is supplied via a line 9 to the power amplifier 3 in order to control the power of the power-output unit 4.

The following section explains how the forward-control signal $RS_V$ and the return-control signal $RS_R$ are generated according to the invention.

For this purpose, the forward signal $U_V$ is supplied to a selective forward signal branch 10, which, in the exemplary embodiment presented, consists of a first low-pass filter 11, a first mixer 12, a first intermediate-frequency filter 13, a first amplifier 14 and a first rectifier 15. In a corresponding manner, the return signal $U_R$ is supplied to a return signal branch 16, which, in the exemplary embodiment presented, consists of a second low-pass filter 17, a second mixer 18, a second intermediate-frequency filter 19, a second amplifier 20 and a second rectifier 21.

The optional low-pass filters 11 and 17 are designed in such a manner that their cut-off frequency either corresponds to the maximum operating frequency of the transmission device or is disposed somewhat above this maximum operating frequency. For example, if the transmission device is designed for shortwave operation up to a maximum of 30 MHz, the cut-off frequency of the low-pass filters 11 and 17, as illustrated in FIG. 1, corresponds to this maximum operating frequency of 30 MHz.

The mixers 12 and 18 convert the low-pass-filtered forward signal $U_V$ and respectively the low-pass-filtered return signal $U_R$ into an intermediate-frequency level independent of the operating frequency of the transmission device, for example, in the illustrated exemplary embodiment, to an intermediate-frequency of 83.16 MHz. The passband frequency of the intermediate-frequency filter 13 or respectively in 19, which is designed as a band-pass filter, is disposed at this fixed intermediate-frequency. The intermediate-frequency filters 13 and 19 are preferably designed as surface-wave filters, because, with surface-wave filters, steep edge gradients can be achieved in the frequency response.

In the illustrated exemplary embodiment, the signal is mixed upwards by the mixers 12 and 18 to an intermediate frequency disposed above the maximum operating frequency of the transmission device. This is preferred, because it certainly avoids the radiation of the intermediate frequency in the useful frequency range. However, this is in no sense compulsory. With adequate screening of the selected signal branches 10 and 16, the intermediate frequency can also be disposed within the useful range of the transmission device.

However, it must be emphasized that the filtering takes place at a constant intermediate-frequency level and not in the baseband as in the prior art. As already described in the introduction, this achieves substantially-improved filtering and therefore substantially-improved selectivity by comparison with the low-pass filtering of the I and Q components in the baseband known from the prior art. The surface-wave filters require only a small structural space and low production costs.

A pre-amplification of the filtered intermediate-frequency signal is implemented in the optional pre-amplifiers 14 and 20 before each signal is supplied to a rectifier 15 or respectively 21, which rectifies the signal and finally subjects it to low-pass filtering. The selective forward-control signal $RS_{SV}$ is provided at the output of the selective forward signal path 10, while the selective return-control signal $RS_{SR}$ is provided at the output of the selective return signal branch 16.

The selective forward-control signal $RS_{SV}$ corresponds directly to the forward-control signal $RS_V$ supplied to the controller 8. By contrast, in the preferred exemplary embodiment presented in FIG. 1, the selective return-control signal $RS_{SR}$ is supplied to a signal combiner 22, which combines the selective return-control signal $RS_{SR}$ with a broadband, non-selective return-control signal $RS_{BR}$ to form the effective return-control signal $RS_R$, which is supplied to the controller 8.

A broadband forward signal branch 23, which is formed, in the illustrated exemplary embodiment, by a third rectifier 25 and a third amplifier 26, is used to generate a broadband, non-selective forward-control signal $RS_{BV}$, wherein the forward signal $U_V$ is supplied to the third rectifier 25 without selection means connected upstream. In a corresponding manner, a broadband return signal branch 24 is used to generate a broadband, non-selective return-control signal $RS_{BR}$. In the illustrated exemplary embodiment, the broadband return signal branch 24 consists of a fourth rectifier 27 and a fourth amplifier 28, wherein here also, the return signal $U_R$ is supplied directly to the fourth rectifier 27 without selection means connected upstream.

The selective return-control signal $RS_{SR}$ and the broadband return-control signal $RS_{BR}$ are combined with one another in the signal combiner 22 in a nonlinear manner so that, below a specified threshold value of the broadband return-control signal $RS_{BR}$, the selective return-control signal $RS_{SR}$ dominates in the effective return-control signal $RS_R$, while above this threshold value, the selective return-control signal $RS_{SR}$ is over-driven in such a manner that, above this threshold value, the broadband return-control signal $RS_{BR}$ dominates in the resulting return-control signal $RS_R$.

This achieves the following points: if only small influences, for example, from adjacent transmitters, are present outside the operating channel selected by the selective return signal branch 16, the adjacent transmitters do not influence the return-control signal $RS_R$. The signal from adjacent transmitters is, in fact, registered by the broadband return signal branch 24. However, if the signal from the adjacent transmitters is relatively weak and below a critical threshold value, then the broadband return-control signal $RS_{BR}$ has a negligibly small influence or no influence on the effective return-control signal $RS_R$.

However, if the interference from adjacent transmitters is so strong that there is a risk to the power-output unit 4 as a result of the power coupled from external transmitters, the broadband return-control signal $RS_{BR}$ over-drives the selective return-control signal $RS_{SR}$ because of the design of the nonlinear signal combiner 22 in such a manner that the effective return-control signal $RS_R$ is substantially determined by the broadband return-control signal $RS_{BR}$ and therefore by the coupled power of the adjacent transmitters. Since the forward-control signal $RS_V$ is not influenced by the interference from external transmitters, the change in the ratio between $RS_V$ and $RS_R$ caused as a result of the external transmitters causes the controller 8 to reduce the power of the power-output unit 4. This ensures that the sum of the power loss caused in the power-output unit and the power components coupled from external transmitters cannot cause a thermal destruction of the power-output unit 4.

The preferred further development of the invention illustrated in FIG. 1 also provides an emergency shutdown. For this purpose, the selective forward-control signal $RS_{SV}$ is compared in a comparator 29 with the broadband forward-control signal $RS_{BV}$. If the selective forward signal branch 10 is operating correctly, the ratio of $RS_{BV}$ to $RS_{SV}$ must be independent of the transmission power generated in the power-output unit 4 and approximately constant independently of the operating frequency, because the selection of the selective forward signal branch 10 is constantly tracked to the operating frequency. However, if the broadband forward signal $RS_{BV}$ increases disproportionately by comparison with the selective forward-control signal $RS_{SV}$, as established by the comparator 29, this gives reason to conclude that a component of the selective forward signal branch 10 is not operating correctly. For example, the mixer 12 can no longer convert to the intermediate frequency, if the synthesizer 33, which will be described in greater detail below, fails.

If this operational disturbance is recognised by the comparator 29, the comparator communicates an emergency shutdown signal NA, preferably via a delay element (timer) 30, to a control unit 31. This generates a control signal (TX Inhibit), which is supplied via a control line 32 to the power amplifier 3 and leads to the shutdown of the power-output unit 4. By preference, the emergency shutdown signal NA is only supplied to the control unit 31, if it is present in the delay element 30 for a certain minimum time. This avoids error triggering of the emergency shutdown resulting from control delays or an adjustment delay of the synthesizer 33.

By way of completeness, the structure of the synthesizer 33 shown in FIG. 1, which operates according to the Phase Locked Loop principle (PLL) in the illustrated exemplary embodiment, will now be described. The frequency generation in the synthesizer takes place in an oscillator 34, for example, a quartz oscillator, of which the output is supplied to a phase comparator 37 via a Direct Digital Synthesis circuit (DDS) 35 and via a band-pass filter 36. This is connected in the conventional manner via a loop filter 38 to a controlled oscillator 39, normally a voltage-controlled oscillator, of which the output provides one of the two comparison signals for the phase comparator 37. The output signal of the controlled oscillator 39 is connected to the mixers 12 and 18 via appropriate amplifiers 40 and 41, which are also used for de-coupling.

At the same time, the signal from the synthesizer 33 can also advantageously be used for signal conditioning in the signal-conditioning device 2 connected upstream of the power amplifier 3. This has the advantage, on the one hand, that only one synthesizer 33 is required, and, on the other hand, a frequency change is taken into consideration in a synchronous manner in the signal-conditioning device 2 and also in the selective-control branches 10 and 16. The use of the output signal from the synthesizer 33, which is required anyway for signal conditioning, as the reference signal for the mixers 12 and 18 has the additional advantage, that the signal pickup before the power-output unit 4 required in the prior art is no longer required.

By way of completeness, reference is also made to the fact that the control unit 31 can, of course, also fulfil other control functions. For example, an emergency shutdown can also be triggered by an input signal "TX Inhibit", which comes from the surface-wave filters 13 and 19, if one of the two surface-wave filters 13 or 19 fails. The control unit 31 can also take over control of the phase comparator 37 and the DDS circuit 35.

Figure 2:
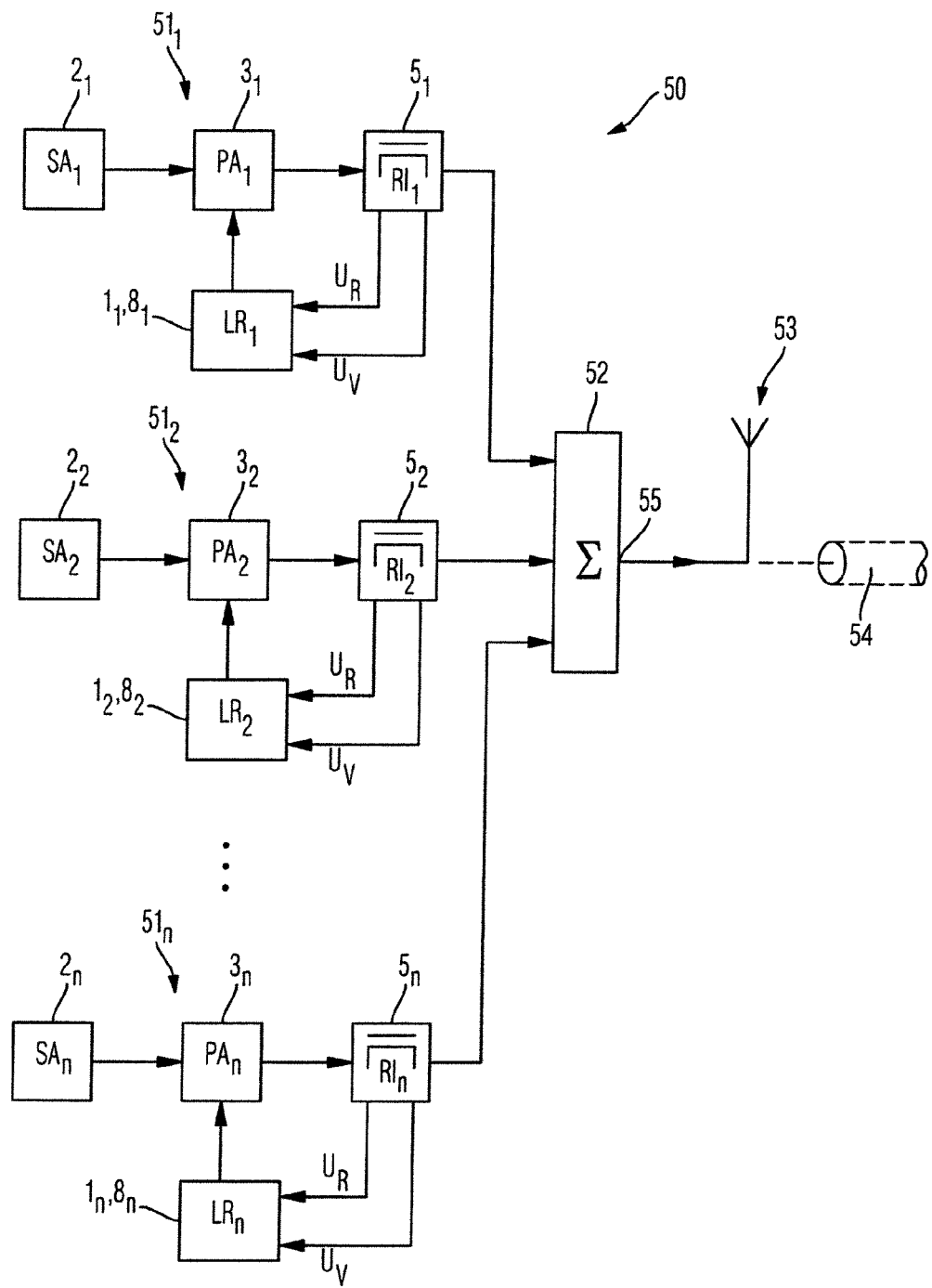

FIG. 2 shows a further possible application for the power-control device 1 with a broadband unit 50 according to the invention. With this broadband unit, several transmission devices $51_1, 51_2, \ldots, 51_n$ are connected together to a signal combiner 52, wherein the combined signal is supplied via a common output 55 to a common antenna 53. A supply to a broadband cable 54 can also be provided instead of the antenna 53; this is illustrated in FIG. 2 by dotted lines. As for the exemplary embodiment illustrated in FIG. 1, each transmission device $51_1, 51_2, \ldots, 51_n$ consists of a signal-conditioning device $2_1, 2_2, \ldots, 2_n$, a power amplifier $3_1, 3_2, \ldots, 3_n$, a directional coupler $5_1, 5_2, \ldots, 5_n$ and a power-control device $1_1, 1_2, \ldots, 1_n$, with a corresponding controller $8_1, 8_2, \ldots, 8_n$. These components operate as explained with reference to FIG. 1 above.

With the broadband unit 50, the particular problem is that each of the other transmission devices $51_1, 51_2, \ldots, 51_n$ interferes with a given transmission device $51_1$ and can lead to a destruction of the power-output unit of the respective power amplifier $3_1$. In fact, the signal combiner 52 ensures a certain de-coupling of the individual transmission devices $51_1, 51_2, \ldots, 51_n$, however, the return signal $U_R$ from the adjacent transmission devices is not uninfluenced. If the signal combiner 52 is damaged, for example, through overheating, an unacceptably high interference from the adjacent transmission devices cannot be excluded. The combination of the selective return with the broadband return as presented in FIG. 1 is therefore particularly valuable in this application.

The invention is not restricted to the exemplary embodiment illustrated and can be realised in a different manner. In particular, the broadband return signal branch and its combination with the selective return single branch, the broadband forward signal branch and the emergency shutdown are only optional further developments of the invention, which are not absolutely necessary according to the invention. The same applies for the supply of the mixers 12 and 18 by the synthesizer 33. As in the case of the prior art, a signal pickup before the power amplifier 3 could also be considered as an alternative to the generation of the reference signal for the mixers 12 and 18.

The invention claimed is:

1. Power-control device for a power-output unit, said power-control device comprising:
   only one directional coupler for obtaining a forward signal corresponding to a forward wave on a wave supply line and a return signal corresponding to a return wave on the wave supply line; and
   a controller to which the forward and return signals are supplied after a narrow-band selection in order to control the power of the power-output unit,
   wherein a transmission device includes the power-control device, and
   wherein the narrow-band selection is implemented at a constant intermediate-frequency level above the maximum operating frequency of a baseband of the transmission device, and wherein the return signal is supplied to a return signal branch having both a broadband and a selective signal branch.

2. Power-control device according to claim 1, comprising a selective forward signal branch with a first mixer and a first narrow-band intermediate-frequency filter to which the forward signal is supplied in order to obtain a selective forward-control signal.

3. Power-control device according to claim 2, comprising a selective return signal branch with a second mixer and a second narrow-band intermediate-frequency filter to which the return signal is supplied in order to obtain a selective return-control signal.

4. Power-control device according to claim 2 wherein the first narrow-band intermediate-frequency filter is a surface-wave filter.

5. Power-control device according to claim 2, comprising a frequency synthesizer establishing an operating frequency of a signal-conditioning device connected upstream of the power-output unit generating a signal supplied to the first mixer.

6. Power-control device according to claim 5, wherein the frequency synthesizer contains a PLL (Phase Locked Loop).

7. Power-control device according to claim 2, comprising a first low-pass filter connected indirectly or directly upstream of the first mixer, of which a respective cut-off frequency corresponds to the highest operating frequency of the power-output unit.

8. Power control device according to claim 2, comprising a first rectifier connected indirectly or directly downstream of the first intermediate-frequency filter.

9. Power-control device according to claim 2, wherein the forward signal is supplied to a broadband forward signal branch in order to obtain a non-selective, broadband forward-control signal.

10. Power-control device according to claim 9, wherein the broadband forward signal branch contains a third rectifier.

11. Power-control device according to claim 9 comprising a comparator to which the selective forward-control signal ($RS_{SV}$) and the broadband forward-control signal ($RS_{BV}$) are supplied, which comparator generates an emergency shutdown signal, which leads to the shutdown of the power-output unit when a predetermined ratio between the broadband forward-control signal and the selective forward-control signal is exceeded.

12. Power-control device according to claim 11, wherein the emergency shutdown signal is supplied via a delay element to a control unit in order to control the power-output unit.

13. Power-control device according to claim 3, wherein the return signal is supplied to a broadband return signal branch in order to obtain a non-selective, broadband return-control signal.

14. Power-control device according to claim 13, wherein the broadband return signal branch contains a fourth rectifier.

15. Power-control device according to claim 13, wherein the broadband return-control signal over-drives the selective return-control signal in a signal combiner in such a manner that the broadband return-control signal dominates the selective return-control signal from a given signal level.

16. Power-control device according to claim 15, wherein the over-driven effective return-control signal generated in the signal combiner and the selective forward-control signal are supplied to the controller, which reduces the power of the power-output unit increasingly as the ratio of the over-driven, effective return-control signal relative to the selective forward-control signal increases.

17. Power-control device according to claim 1, wherein the power-control device is part of a broadband unit, the broadband unit having several transmission devices, wherein outputs of the transmission devices are connected together via a signal combiner to form a common output.

18. Power-control device according to claim 3, wherein the second narrow-band intermediate-frequency filter is a surface-wave filter.

19. Power-control device according to claim 3, comprising a frequency synthesizer establishing an operating frequency of a signal-conditioning device connected upstream of the power-output unit generating a signal supplied to the second mixer.

20. Power-control device according to claim 19, wherein the frequency synthesizer contains a PLL (Phase Locked Loop).

21. Power-control device according to claim 3, comprising a second low-pass filter connected indirectly or directly upstream of the second mixer, of which a respective cut-off frequency corresponds to the highest operating frequency of the power-output unit.

22. Power control device according to claim 3, comprising a second rectifier connected indirectly or directly downstream of the second intermediate-frequency filter.

* * * * *